United States Patent
Ghio et al.

[11] Patent Number: 6,051,443
[45] Date of Patent: Apr. 18, 2000

[54] METHOD FOR ASSESSING THE EFFECTS OF PLASMA TREATMENTS ON WAFERS OF SEMICONDUCTOR MATERIAL

[75] Inventors: Emilio Ghio; Simone Alba, both of Milan; Andrea Colognese, Padua, all of Italy; François Maugain, La Ciotat, France; Giovanni Rivera, Montova, Italy

[73] Assignee: STMicroelectronics S.R.L, Milan, Italy

[21] Appl. No.: 08/990,617

[22] Filed: Dec. 15, 1997

[30] Foreign Application Priority Data

Dec. 16, 1996 [EP] European Pat. Off. ............. 96830625

[51] Int. Cl.[7] .................................................. H01L 21/66
[52] U.S. Cl. ................................................................ 438/17
[58] Field of Search .......................................... 438/10, 17

[56] References Cited

U.S. PATENT DOCUMENTS

| | | | |
|---|---|---|---|
| 5,315,145 | 5/1994 | Lukaszek | 257/379 |
| 5,376,897 | 12/1994 | Schrimpf et al. | 324/72 |
| 5,594,328 | 1/1997 | Lukazek | 324/72 |
| 5,869,877 | 2/1999 | Patrick et al. | 257/429 |

FOREIGN PATENT DOCUMENTS

| | | |
|---|---|---|
| 0 678 909 | 10/1995 | European Pat. Off. . |
| 33 45 172 | 7/1985 | Germany . |
| 02 119159 | 5/1990 | Japan . |

OTHER PUBLICATIONS

"Charm2: Towards an Industry–Standard Wafer Surface–Charge Monitor," *IEEE/SEMI Advanced Seminconductor Manufacturing Conference*, Sep. 30–Oct. 1, 1992, pp. 148–152.

*Primary Examiner*—Brian Dutton
*Attorney, Agent, or Firm*—Jenkens & Gilchrist, P.C.; Theodore E. Galanthay

[57] ABSTRACT

A method for assessing alterations in the dielectric properties of insulating layers on a wafer of semiconductor material induced by plasma treatments. The method includes forming cells of EEPROM type on a wafer with source, drain and control gate surface terminals (pads), subjecting the cells to UV radiation so as to erase them thereby fixing a reference threshold voltage, applying programming voltages of preset value to at least one of the cells and measuring the corresponding threshold voltages, and subjecting this cell to UV radiation so as to restore its threshold to the reference value. The wafer is then subjected to the plasma treatment to be assessed, and the threshold voltages of the cells are measured and compared with the reference threshold voltage so as to derive from the comparison information on the alterations induced on the dielectrics formed on the wafer and on the distribution of the plasma potential.

19 Claims, 2 Drawing Sheets

METHOD FOR ASSESSING THE EFFECTS OF PLASMA TREATMENTS ON WAFERS OF SEMICONDUCTOR MATERIAL

FIELD OF THE INVENTION

The present invention relates to the fabrication of semiconductor electronic devices and, more particularly, to a method for assessing the alterations in the dielectric properties of insulating layers induced by the fabrication process.

BACKGROUND OF THE INVENTION

It is known that in standard fabrication processes certain treatments of the wafers of semiconductor material, typically silicon, in which electronic devices are formed, can generate electric potentials on the surface of the wafer such as to damage the active dielectrics of the electronic components during fabrication. In particular, the gate dielectrics of MOS field-effect transistors and the gate dielectrics of programmable non-volatile memory cells (EEPROMs) experience such damage. This can give rise to electronic components with electrical characteristics which are worse than those theoretically obtainable. The treatments which contribute chiefly to this damaging of the dielectrics are those which require the use of plasmas for dry etching or for certain vapor-phase chemical deposition operations (plasma enhanced CVD). Furthermore, the effect of these treatments can vary from point to point on the surface of the wafer on account of intrinsic non-uniformities in the apparatuses in which they are developed, so that the devices obtained have differing characteristics depending on their position on the wafer. This, in turn, may negatively influence the production yield.

Therefore, both the constructors and the users of equipment, in particular that for treatments with plasma, feel the need to be able to employ efficient probes and methods to analyze the behavior of equipment and the alterations induced by the treatment on the dielectric properties of the insulating layers of the wafers treated. A good probe and a good method of assessment should have the following characteristics:

speed of analysis of the measurement, sensitivity, capacity to detect alterations of charge both in modulus and in sign, reproducibility of measurements, possibility of directly correlating the measured data with the effects of the treatments on devices obtained using the same treatments, possibility of real-time assessment of geometrical effects, such as for example effects of charging by plasma on two very closely spaced electrical interconnection tracks ("shading effect").

In programmable non-volatile memory cells, of the type consisting of an MOS transistor having a floating gate electrode and a control gate electrode, charge sensors have been used for assessing the uniformity of the potential induced on the wafer by a plasma treatment. For example, a technique is known, described in the publication "CHARM wafer characterization" Reedholm Technical Note TN-1 June 1996, in which EEPROM cells formed on a wafer according to a preset surface distribution pattern, are programmed up to threshold saturation, i.e. such as to determine the maximum conduction threshold of the respective cells. The cells are programmed partly with the maximum positive threshold and partly with the maximum negative threshold.

The wafer is then subjected to a treatment, such as a plasma treatment, in order to assess its effects on the wafer.

The surface terminals (pads) of the cells, in particular those connected to the control gate electrodes, have the function of "antenna" areas, i.e. of collectors of the charge induced by the plasma. In those cells programmed with a positive threshold (electrons stored in the floating gate) any negative potential applied to the control gate during exposure to the plasma may extract electrons from the floating gate and thereby induce a reduction in the threshold voltage. The opposite occurs in those cells programmed to saturation with a negative threshold: a positive plasma potential induces an increase in the threshold voltage.

Next, the threshold voltages of the cells are measured and these are compared with the initial maximum threshold voltages. On the basis of the variations in the measured threshold voltage it is possible in this way to get back to the charging potential applied to the control gate during exposure to the plasma.

The known method described briefly above has the following drawbacks.

The programming of the cells up to the saturation value of the threshold has to be carried out with high voltage values applied between the control gate and the substrate. This engenders a heavy electrical loading of the cell, in particular of the dielectric between floating gate and substrate and of the dielectric between control gate and floating gate, and this may compromise the accuracy and reproducibility of the measurement of the plasma potential.

Since different cells are used to detect positive and negative potentials, in order to have a complete map of the changes in the plasma potential over the surface of the wafer, which are determined by the contributions from the charge carriers, both positive and negative, it is necessary to combine the results of two series of measurements. This constitutes a significant complication of the procedures for processing the data from the measurements.

During exposure to the plasma an EEPROM cell also undergoes, in addition to the effects of the electric potential applied to the control gate, the effects due to bombardment with UV photons which are generated in the actual plasma. As is known, exposure to UV rays engenders a variation in the electron distribution in the floating gate. Consequently, the threshold attained after exposure to the plasma is in reality a value resulting from the sum of the two effects mentioned.

Furthermore, the known method does not allow direct assessment of the effects of exposure to the plasma on actual devices.

Thus, what is needed is a method of the type defined at the outset which does not have the drawbacks of the prior art and thus allows reliable and reproducible measurements, directly delivers the changes in the surface potential in the case of plasma treatments, is able to give accurate results even in the presence of UV radiations during the treatment and enables the measured data to be correlated directly with the effects of the treatment, for example exposure to the plasma, on actual devices.

SUMMARY OF THE INVENTION AND ADVANTAGES

Accordingly, a method for assessing the effects of a preset treatment on a wafer of semiconductor material is set forth. The method includes the step of forming on the wafer, according to a preset surface distribution pattern, a multiplicity of programmable non-volatile memory cells each having a source region, a drain region separated from the source region by a channel, and a floating gate electrode and a control gate electrode. The method further includes forming on the wafer source, drain and control gate surface terminals connected, respectively, to the source and drain regions and to the control gate electrodes of the cells. The method further includes subjecting the cells to a treatment such as to define a reference conduction threshold voltage for each cell, applying programming voltages of preset value to at least one of the cells and measuring the corresponding threshold voltages, subjecting the cells thus programmed to a second treatment such as to restore the respective threshold voltages to the reference threshold voltage, subjecting the wafer to the preset treatment, measuring the threshold voltages of the cells and comparing them with the respective reference threshold voltages and deriving information on the effects of the preset treatment from the comparison.

Additional objects, advantages, novel features of the present invention will become apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

BRIEF DESCRIPTION OF THE DRAWINGS

The method of the invention and the advantages stemming therefrom will be better understood from reading the following description of a preferred embodiment given in conjunction with the appended drawings, in which.

DETAILED DESCRIPTION OF A PREFERRED EMBODIMENT OF THE INVENTION

Figure 1:
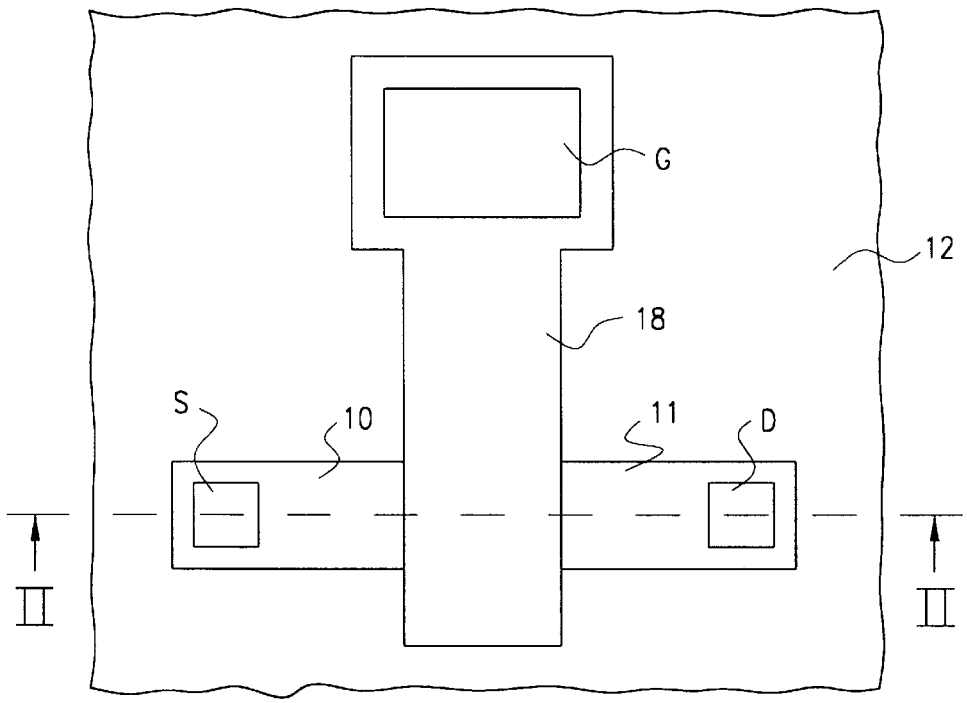
FIGS. 1 and 2 represent, in plan and in section respectively, an EEPROM memory cell formed on a wafer of semiconductor material usable as a probe in a method according to the present invention.
Figure 2:
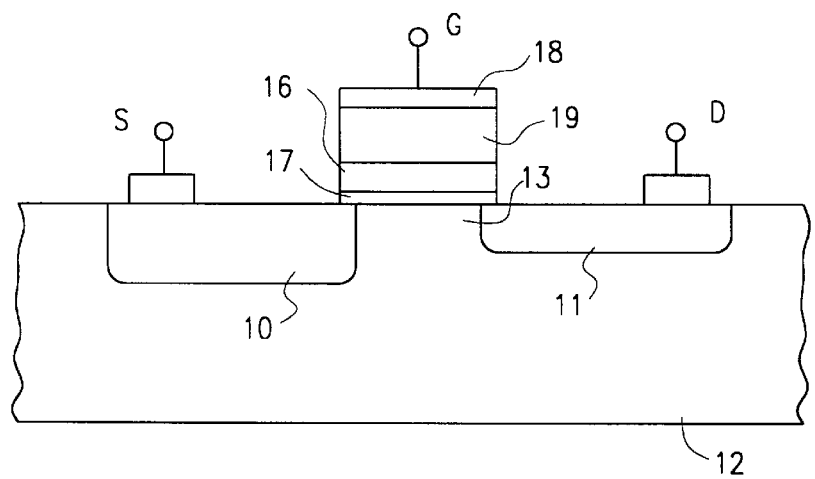

In order to produce a probe usable with a method according to the present invention, a multiplicity of EEPROM memory cells of known type is formed on a substrate consisting of a wafer of semiconductor material, for example silicon, according to a preset distribution on the surface of the wafer. The cells can be of the type used for "flash" memories or some other type, provided that they have, as shown in FIGS. 1 and 2, source and drain regions, 10 and 11 respectively, formed on the substrate 12 and separated by a channel 13, a floating gate electrode 16, of for example polycrystalline silicon, separated from the substrate 12 by a thin gate dielectric layer 17 and a control gate electrode 18 separated from the floating gate by a thicker dielectric layer 19. Source, drain and control gate surface metal terminals (pads), indicated as S, D and G respectively, are formed on the wafer to constitute electrical contact areas for connecting up external measuring instruments with the source and drain regions and with the control gate electrode. Such a cell can be fabricated, for example with a process which allows minimum gate lengths of 0.5 $\mu$m and a minimum thickness of gate dielectric of 12 nm, but naturally other types of process characterized by different geometrical values can be used.

The memory cells formed on the wafer in this example are all identical. However, the method of the invention is usable also with wafers having different memory cells.

According to the method of the present invention, the cells are first subjected to a treatment such as to define a conduction threshold voltage, in this example identical for all the cells, which constitutes a reference threshold. Preferably this threshold is that which corresponds to a charge balance between floating gate and the substrate, i.e. that which is obtained by subjecting the wafer to UV radiation so as to "erase" the cells.

Figure 3:
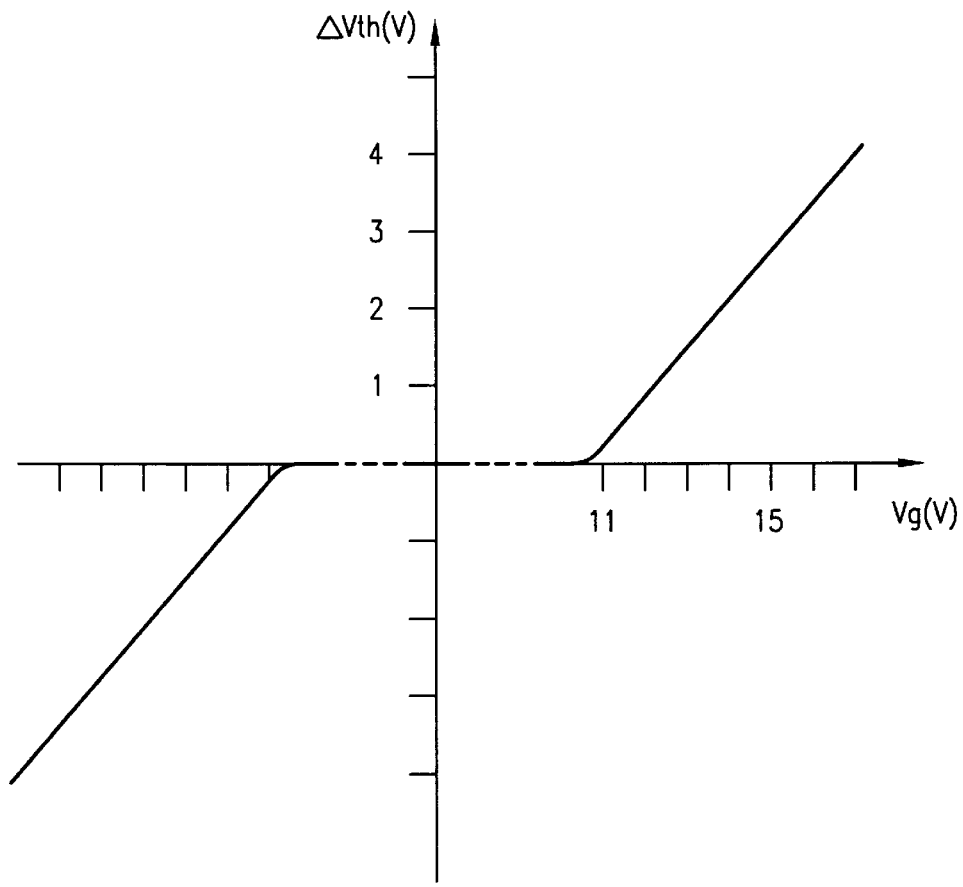
FIG. 3 is a graph which represents the variations in the measured threshold voltages versus the control gate voltages of the memory cells of a wafer in one phase of a method according to the present the invention.

The probe is then calibrated by applying preset programming voltages to the cells and measuring the corresponding threshold voltages. In the case in which the cells are all identical, calibration can be undertaken on a single cell, but it may be appropriate, for greater safety and accuracy of measurement, to undertake it on more than one cell. According to a preferred calibration operation, gradually increasing positive voltages are applied to the control gate electrode of one of the cells, for example in equal steps, up to a maximum value below the saturation value of the positive threshold and the application of negative voltages, likewise increasing, possibly in steps of the same magnitude as the positive steps, up to a maximum negative value below, in absolute value, the saturation value of the negative threshold. Naturally, measurement of the threshold voltage is carried out after each application of a programming voltage. By graphically plotting the programming voltages Vg and the corresponding variations $\Delta$Vth in the threshold voltages with respect to the reference threshold, a calibration curve is obtained for the probe, such as that illustrated in FIG. 3.

The cell is then restored to the reference threshold voltage, i.e., in this example the wafer is exposed to ultraviolet radiation (UV) of intensity and duration which are sufficient to erase the cell. The wafer is now ready to be used as a probe in assessing the effects of a treatment which might alter the dielectric properties of the insulators. It is therefore inserted, for example, into an apparatus for the plasma etching of metal layers. In order to preclude the metal surface electrodes from being etched, the plasma is kept inactive with regard to the metal by using particular known expedients, for example by generating the plasma in an atmosphere of inert gas.

For the purposes of the plasma treatment, the threshold voltages of the cells are measured and compared with the reference threshold voltage. Since each cell represents the specific condition of exposure to the plasma of the area of the wafer occupied thereby, or, more precisely, occupied by the control gate electrode terminal which functions as antenna, the data obtained make it possible to draw a map of the distribution of the plasma potential over the wafer.

To obtain the greatest possible amount of information on the effects of the plasma on the dielectrics of the wafer, according to a particularly advantageous mode of execution of the method of the invention, before subjecting the wafer to the plasma treatment, a layer of a plasma-impermeable material, for example a layer of standard photosensitive material, or photoresist, used in the customary photolithographic treatments of processes for fabricating semiconductor devices, is applied to the wafer. This masking layer has apertures on only some of the surface metal terminals, for example on only those of the control gate electrodes of the cells.

Figure 4:
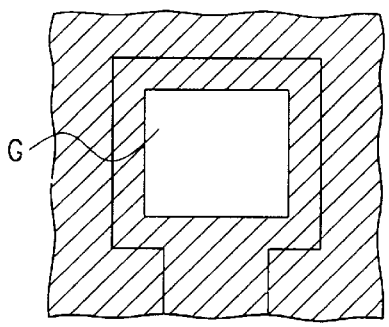
FIGS. 4 and 5 represent two possible shapes of a photoresist mask applied to a wafer according to a preferred application of a method according to the present invention.
Figure 5:
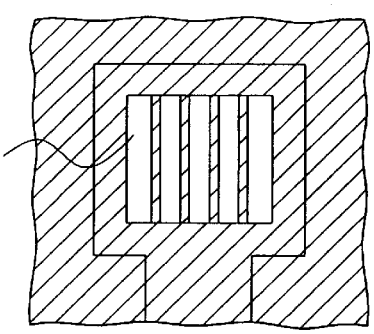

These apertures can be shaped according to structures of similar form to that of structures typical of semiconductor devices to be produced using the same plasma treatment. Two examples of differently shaped apertures of a resist mask are represented in FIGS. 4 and 5. The structure of FIG. 4 enables the whole of the area of the terminal to be exposed to the plasma, whilst that of FIG. 5 allows partial exposure suitable for simulating typical geometrical effects in a layout of a semiconductor device.

It should be noted that the photoresist mask also has the effect of blocking the UV photons generated in the plasma and, therefore, of allowing effective measurement of the electrical potential generated by the plasma on the surface of the wafer.

The photolithographic process for producing the photoresist mask should be carried out with special expedients so as to avoid phenomena of electrostatic charging of the photoresist which could alter the results of the measurement. More particularly, after developing the layer of photoresist applied to the wafer with the standard systems, instead of washing the wafer with the standard centrifuging treatments, washing is carried out by immersion in deionized water followed by manual drying of the wafer. After exposure to the plasma, the photoresist is removed by standard wet chemical etching.

Figure 6:
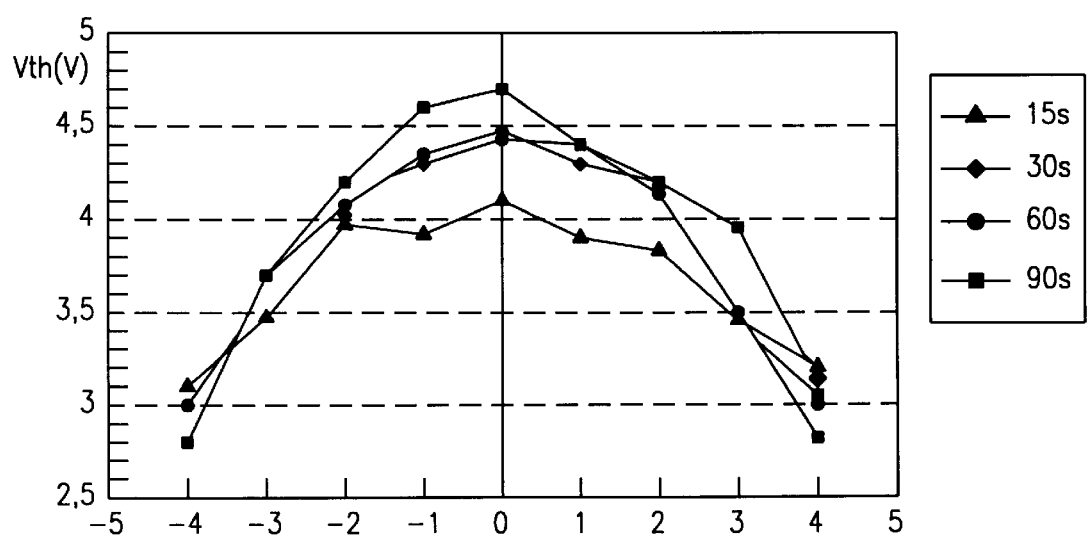
FIG. 6 is a graph which represents an example of the distribution of the threshold voltages of the memory cells measured along a diameter of a wafer according to a method of the present invention.

An example of the distribution on a wafer of the threshold voltages Vth measured along a diameter of the wafer for various plasma exposure times is represented in the graph of FIG. 6. The center of the wafer is indicated as 0. The unit of distance measurement is arbitrary.

The method according to the invention makes it possible to obtain the following advantages with respect to the prior art:

greater sensitivity in measuring the charging potential by plasma under operating conditions, greater reliability and reproducibility, given that high programming voltages are not required, possibility of obtaining changes in surface potential (in modulus and sign) over the wafer such as to be able to provide useful information for the design of equipment for plasma treatments and to increase the production yield for semiconductor devices, and the use of the photoresist mask on the wafer during exposure to the plasma makes it possible to reproduce the geometrical effects which may be obtained on a device subjected to the same treatment during a normal fabrication process and makes it possible to avoid the effects of the UV photons generated during the plasma treatment.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method for assessing the effects of an alteration treatment on a wafer of semiconductor material, comprising the steps of:

forming on the wafer, according to a surface distribution pattern, a multiplicity of programmable non-volatile memory cells each having a source region, a drain region separated from the source region by a channel, a floating gate electrode and a control gate electrode;

forming on the source region, the drain region and control gate electrode surface terminal of each programmable non-volatile memory cell;

subjecting at least one programmable non-volatile memory cell to a first treatment to define a reference conduction threshold voltage for the at least one programmable non-volatile memory cell;

applying programming voltages to the at least one programmable non-volatile memory cell and measuring threshold voltages corresponding to each programming voltage;

subjecting the at least one programmable non-volatile memory cell thus programmed to a second treatment to restore the corresponding threshold voltage to the reference conduction threshold voltage;

subjecting the wafer to the alteration treatment;

measuring the threshold voltage of the at least one programmable non-volatile memory cell and comparing the measured threshold voltage with the reference conduction threshold voltage; and deriving information on the effects of the alteration treatment from the comparison.

2. The method according to claim 1, wherein the alteration treatment is a plasma-based treatment.

3. The method according to claim 1, wherein the programmable non-volatile memory cells are all identical and the reference conduction threshold voltage defined for each programmable non-volatile memory cell is identical for all the programmable non-volatile memory cells.

4. The method according to claim 1, wherein the step of applying programming voltages to the at least one of the programmable non-volatile memory cell includes the step of applying gradually increasing positive voltages up to a maximum positive value and gradually decreasing negative voltages to a maximum negative value successively to the control gate electrode of the at least one programmable non-volatile memory cell.

5. The method according to 1, wherein the first and second treatments each includes the step of exposing the wafer to ultraviolet radiation of intensity and duration to sufficiently erase the programmable non-volatile memory cells.

6. The method according to claim 1, further comprising the step of applying a masking layer of plasma-impermeable material before the step of subjecting the wafer to the alteration treatment to the wafer to only expose, at least partially, at least some of said surface terminals.

7. The method according to claim 6, wherein the at least partly exposed surface terminals are control gate terminals of the programmable non-volatile memory cells.

8. The method according to claim 7, wherein the application of a masking layer is a photolithographic process using photosensitive material.

9. The method according to claim 8, further including the steps of:

washing the photosensitive material by immersion in deionized water after the step of applying a masking layer;

drying the wafer after the step of washing the photosensitive material; and removing the photosensitive material by etching after the step of subjecting the wafer to the alteration treatment.

10. The method according to claim 6, wherein the masking layer forms on at least some of the surface terminals structures of similar form to that of structures typical of a semiconductor device to be fabricated using the alteration treatment.

11. A method for assessing effects of plasma treatments on a wafer of semiconductor material, said semiconductor material having a plurality of memory cells defined thereon, the method comprising the steps of:

characterizing at least one memory cell;

applying an electrical state to said at least one memory cell to define a reference conduction threshold for said at least one memory cell;

subjecting said wafer to a plasma-based treatment;

measuring a threshold voltage of said at least one memory cell; and comparing said threshold voltage of said at least one memory cell to the corresponding reference conduction threshold.

12. The method according to claim 11, wherein said step of characterizing comprises the steps of:

applying a voltage state to said at least one memory cell to define a reference conduction threshold for said at least one memory cell;

applying at least one programming voltage to a control terminal of said at least one memory cell; and measuring a threshold voltage of said at least one memory cell.

13. The method according to claim 12, wherein the step of applying said at least one programming voltage to said control terminal of said at least one memory cell includes the step of applying gradually increasing positive voltages up to a maximum positive value and gradually decreasing negative voltages down to a maximum negative value to said control terminal of said at least one memory cell.

14. The method according to claim 11, wherein the step of setting includes the step of exposing the wafer to ultraviolet radiation having an intensity and a duration to erase the memory cells.

15. The method according to claim 11, wherein the memory cells are programmable non-volatile memory cells.

16. The method according to claim 11, further including the step of applying a masking layer of plasma-impermeable material to the wafer to only expose, at least a portion of, at least one control gate terminals of the memory cells.

17. The method according to claim 16, wherein the masking layer is a layer of photosensitive material.

18. The method according to claim 17, further comprising the steps of:

washing said photosensitive material by immersion in deionized water after said step of applying a masking layer;

drying said wafer after said step of washing said photosensitive material; and removing said photosensitive material, after said plasma-based treatment induces alterations, by etching.

19. The method according to claim 18, wherein etching includes wet chemical etching.

* * * * *